(12) United States Patent
Alyaser et al.

(10) Patent No.: US 8,274,787 B2
(45) Date of Patent: Sep. 25, 2012

(54) THERMAL INTERPOSER LIQUID COOLING SYSTEM

(75) Inventors: Monem H. Alyaser, San Jose, CA (US); Jeremy A. Rice, San Jose, CA (US)

(73) Assignee: Asetek A/S, Bronderslev (DK)

( * ) Notice: Subject to any disclaimer, the term of this patent is extended or adjusted under 35 U.S.C. 154(b) by 117 days.

(21) Appl. No.: 12/826,736

(22) Filed: Jun. 30, 2010

(65) Prior Publication Data
US 2010/0296239 A1    Nov. 25, 2010

Related U.S. Application Data

(63) Continuation-in-part of application No. PCT/US2009/044813, filed on May 21, 2009.

(60) Provisional application No. 61/054,992, filed on May 21, 2008.

(51) Int. Cl.
*H05K 7/20* (2006.01)

(52) U.S. Cl. .............. 361/679.53; 361/679.52; 361/699; 361/700; 361/702

(58) Field of Classification Search .................. None
See application file for complete search history.

(56) References Cited

U.S. PATENT DOCUMENTS

| | | | |
|---|---|---|---|
| 6,411,512 B1 | 6/2002 | Mankaruse et al. | |
| 6,687,126 B2 * | 2/2004 | Patel et al. | 361/702 |
| 6,839,235 B2 * | 1/2005 | St. Louis et al. | 361/700 |
| 7,365,972 B2 * | 4/2008 | Chen et al. | 361/679.41 |
| 7,450,387 B2 * | 11/2008 | Cheng et al. | 361/704 |
| 7,552,758 B2 * | 6/2009 | Garner et al. | 165/80.4 |
| 7,888,786 B2 * | 2/2011 | Andry et al. | 257/690 |
| 2004/0190255 A1 | 9/2004 | Cheon | |
| 2006/0109631 A1 | 5/2006 | Marro et al. | |
| 2007/0188991 A1 | 8/2007 | Wilson et al. | |
| 2007/0211432 A1 | 9/2007 | Peng et al. | |
| 2009/0260782 A1 * | 10/2009 | Whitney et al. | 165/104.21 |

FOREIGN PATENT DOCUMENTS

WO    WO 2009/143330 A2    11/2009

OTHER PUBLICATIONS

PCT International Search Report and PCT Written Opinion of the International Searching Authority for corresponding PCT application PCT/US2009/044813, mailed Jan. 4, 2010, (8 pages total).

* cited by examiner

*Primary Examiner* — Boris Chervinsky
(74) *Attorney, Agent, or Firm* — Finnegan, Henderson, Farabow, Garrett & Dunner LLP (57) ABSTRACT

A thermal interposer for a heat-generating electronic component includes a thermally conducting body that is configured to be thermally coupled to the electronic component. The thermally conducting body may include a first region that is located on a first face of the thermally conducting body. The first region may be adapted to be in thermal contact with a surface of the electronic component. The thermally conducting body may also include a second region located on a second face that is opposite the first face of the thermally conducting body. The thermal interposer may also include a cold plate assembly that is removably coupled to the thermally conducting body. The cold plate assembly may be in thermal contact with the second region of the thermally conducting body. The cold plate assembly may include an inlet adapted to receive a cooling liquid into the cold plate assembly and an outlet adapted to discharge the cooling liquid from the cold plate assembly.

25 Claims, 5 Drawing Sheets

THERMAL INTERPOSER LIQUID COOLING SYSTEM

CROSS-REFERENCE TO RELATED APPLICATIONS

This application is a Continuation-in-Part application of PCT International Application No. PCT/US09/044,813 filed on May 21, 2009, which claims the priority of U.S. Provisional Patent Application Ser. No. 61/054,992 filed on May 21, 2008, both of which are incorporated herein by reference in their entirety.

TECHNICAL FIELD

The present invention is related generally to a system for cooling electronic components, and heat sources associated with electronic components.

BACKGROUND

Computer systems, such as, for example, personal computers, which are designed for desktop or under-desk use are typically characterized by a main-board or motherboard housed in a chassis or case. Auxiliary components additionally contained within the chassis or case may include, among others, network adapter circuit boards, modems, specialized adapters, and graphics display adapters. These auxiliary components may receive power through connection to the motherboard or through additional connections directly to a system power supply contained within the chassis or case. Additional components which generate heat, such as hard drives, disk drives, media readers, etc. may further be contained within the chassis or case, and coupled to the system power supply and/or motherboard as needed.

During operation, the motherboard and various auxiliary components consume power and generate heat. To ensure proper functionality of the computer system, it is necessary to regulate the operating temperatures inside the chassis or case. Individual integrated circuits, such as, for example, central processing units (CPUs), graphics processing units (GPUs), memory modules, etc. may generate significant amounts of heat during operation. This heat may result in undesirably high temperature at the components or localized hot spots within the chassis. In this disclosure, the term "processors", are used as understood by one of ordinary skill in the art, to describe a wide range of components. These components may include dedicated graphics processing units, microprocessors, microcontrollers, digital signal processors, and general system processors. In an air-cooled system, the generated heat is absorbed by the ambient air within the chassis, which is then circulated or exchanged by various cooling fans. Failure to maintain adequate temperature control within the chassis, and at individual integrated circuits, can degrade system performance and may eventually lead to component failure.

Traditionally, a cooling fan is used to circulate air within the chassis and to exchange the high temperature internal air with cooler external air. However, as personal computer systems include increasing numbers of individual components, such as, for example, integrated circuits and graphics display adapters, a supply cooling fan may be inadequate to maintain the necessary operating temperatures within the chassis environment.

Specialized liquid cooling systems are available for some components in a personal computer system. Specialized liquid cooling systems typically require a coolant circulation pathway, which routes a thermal transfer liquid between a heat exchanger such as a radiator and a heat source, such as a CPU, GPU, or other electronic component. Specialized liquid cooling systems are well adapted to maintain the operating temperatures of individual components within acceptable limits. However, these specialized liquid cooling systems are not adapted for use with a wide variety of components or adapter boards in a personal computer system. Furthermore, once such liquid cooling systems are installed, often it is difficult to replace, insert, or remove components requiring cooling from the system. To replace or add components, the liquid cooling system must either be drained or breached to facilitate the replacement, insertion, or removal.

Some specialized liquid cooling systems adapted for use with plug-in adapter cards such as graphic cards utilize a cold plate component through which a cooling liquid circulates for cooling the main processor on the adapter card, and thermal radiators for air cooling the other circuit components on the adapter card. These systems often add significant space requirements to the adapter card, necessitating the use of two adapter "slots" or bays. Additionally, by continuing to utilize thermal radiators for air cooling, these systems contribute heat to the internal environment within the computer chassis, increasing the strain on other cooling components.

Personal computers are not the only electronic devices which generate heat during use. Many electronic devices contained within a chassis or a case generates heat during use which must be dissipated. For example, multiple circuit boards, DC/DC converters, hard drives, optical components, rack-mounted servers, blade servers, networking switches and routers, network storage devices, military and medical electronic equipment, game consoles, as well as instrumentation and testing electronics all generate heat during use which must be dissipated to avoid damage to the system. The cooling systems of the current disclosure are applicable to these applications.

It would be advantageous to provide a component for use with a liquid cooling system which may be easily adapted to provide a liquid cooling mechanism for a wide range of heat-generating integrated circuit components, such as a personal computer adapter card, to cool both the adapter card processors as well as associated integrated circuits. It would be further advantageous to provide a component for a liquid cooling system which may be easily detached from an associated heat source without draining of any liquid coolant or breaching, of the coolant flow pathways, to enable replacement, addition, or removal of electronic components such as processors, and which does not significantly increase the space requirements of the adapter card.

SUMMARY OF THE INVENTION

In one aspect, a thermal interposer for a heat-generating electronic component is disclosed. The thermal interposer may include a thermally conducting body that is configured to be thermally coupled to the electronic component. The thermally conducting body may include a first region that is located on a first face of the thermally conducting body. The first region may be adapted to be in thermal contact with a surface of the electronic component. The thermally conducting body may also include a second region located on a second face that is opposite the first face of the thermally conducting body. The thermal interposer may also include a cold plate assembly that is removably coupled to the thermally conducting body. The cold plate assembly may be in thermal contact with the second region of the thermally conducting body. The cold plate assembly may include an inlet adapted to receive a cooling liquid into the cold plate assembly and an outlet adapted to discharge the cooling liquid from the cold plate assembly.

In another aspect, a liquid cooling system of a computer is disclosed. The cooling system may include a heat exchanger adapted for cooling a cooling liquid, and one or more tubes configured to direct the cooling liquid between the heat exchanger and a thermal interposer assembly. The thermal interposer assembly may be coupled to a first adapter card of the computer and may include a first thermally conducting body in thermal contact with a first heat dissipating electronic component on the first adapter card, and a cold plate assembly removably coupled to the thermally conducting body. The cold plate assembly may be configured to circulate the cooling liquid therethrough.

In yet another aspect, a thermal interposer for a heat-generating electronic component located on an adapter card of a computer is disclosed. The adapter card may be plugged into a mother board of the computer. The thermal interposer may include a thermally conducting assembly having a length and a width substantially the same as the adapter card removably coupled to the adapter card such that a first region of the thermally conducting assembly is in thermal contact with a surface of the electronic component. The thermal interposer may also include a cold plate assembly removably coupled to the thermally conducting assembly. The cold plate assembly may be configured to circulate a liquid coolant therethrough.

DETAILED DESCRIPTION

The following detailed description illustrates the invention by way of example and not by way of limitation. The description enables one skilled in the art to make and use the present disclosure, and describes several embodiments, adaptations, variations, alternatives, and uses of the present disclosure, including what is presently believed to be the best mode of carrying out the present disclosure.

Personal computers, network servers, and many other variations of computing devices employ electronic sub-components such as circuit boards, adapter cards, daughter cards, DC/DC converters, hard drives, and optical drives mounted in an enclosed case or chassis. These various electronic sub-components, including a common power supply, generate heat during operation which must be dissipated from the chassis or case to avoid heat-induced damage or overheating of the various components. Common methods for extracting heat from the internal volume of a computer case or chassis include providing cooling fans for circulating airflow, and the use of liquid cooling systems to circulate a liquid coolant between the various sources of heat and a liquid-to-air radiator for discharge outside of the chassis. Typically, to utilize a circulating liquid coolant within a computing device case or chassis, individual components much be customized or configured with coolant flow pathways for connecting to the liquid coolant circulation system. Installation, removal, or replacement of components is difficult due to the need to breach the liquid coolant circulation system when altering the component configurations, resulting in the loss of liquid coolant and/or the introduction of air into the liquid coolant circulation system, which can reduce the thermal efficiency of the system.

Figure 1:
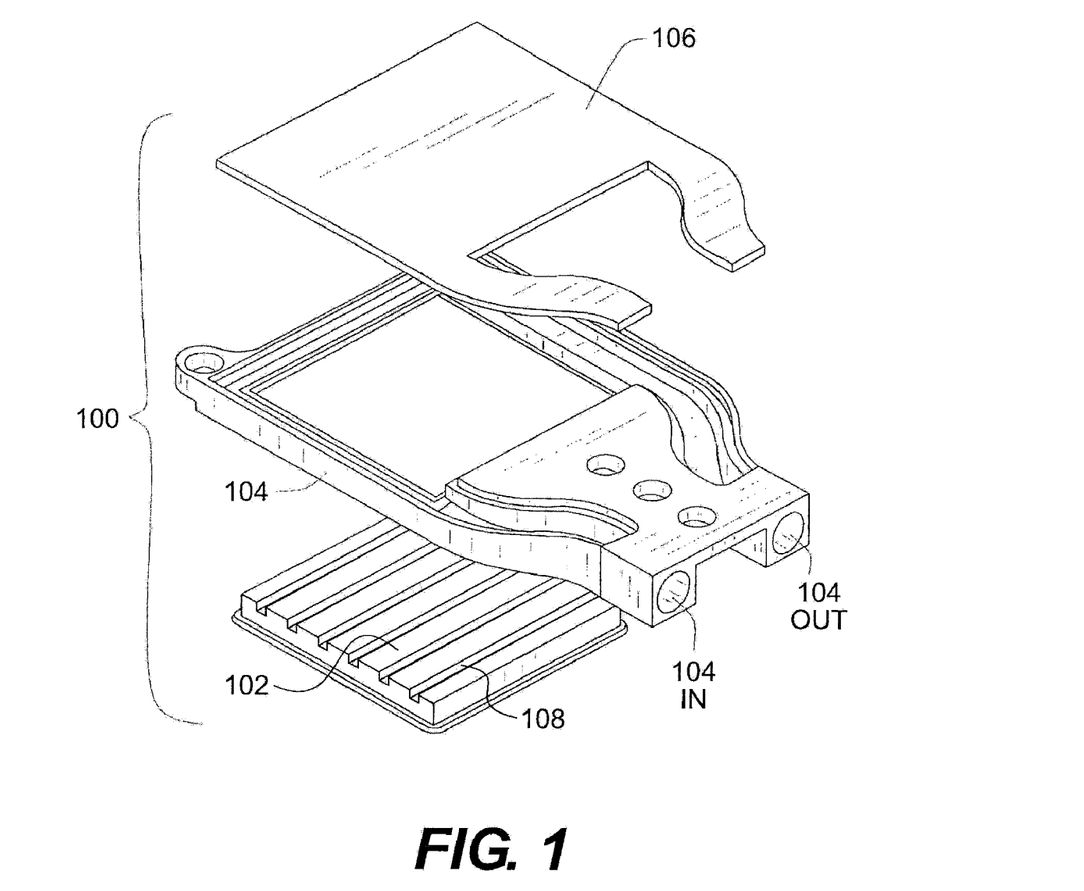
FIG. 1 is an exploded view of an embodiment of a cold plate assembly of the present disclosure.

Turning to FIG. 1, a modular cold plate assembly of the present disclosure is shown generally at 100. The modular cold plate assembly 100 provides a standardized heat transfer component for a liquid cooling system such as may be used within a chassis or case of a computer system. As seen at FIG. 1, the modular cold plate assembly 100 consists of a cold plate body 102, configured for placement in thermal contact to a heat source (not shown), a fluid circulation body 104, configured to direct a liquid coolant into the cold plate assembly 100, and a cover plate 106 configured to enclose the cold plate body 102 within the fluid circulation body 104. The cold plate body may include grooves or micro channels 108 to pass the liquid coolant therethrough. In place of, or in addition to, the micro channels 108, some embodiments of cold plate assembly 100 may include other features (such as, for example, micro pins) to improve heat transfer to the liquid coolant. These features may improve the heat transfer from the cold plate body 102 to the circulating coolant by increasing the surface area available for heat transfer and/or by disrupting the boundary layer at the solid to liquid interface. In some embodiments, these grooves or micro channels 108 on cold plate body 102 may be eliminated. The external dimensions of the modular cold plate assembly 100 may be standardized to facilitate reuse and interchange of the modular cold plate assembly 100 with different thermal interposer components as required from time to time.

The cold plate body 102 may be made from materials (such as, for example, copper, aluminum, etc.) which have a high thermal conductivity to facilitate a transfer of heat. Exemplary cold plate assemblies are shown and described in co-pending International Application No. PCT/US08/56167 and in co-pending U.S. patent application Ser. No. 12/053,202, each of which are incorporated herein by reference. The cold plate body 102 is adapted for placement in thermal contact with the surface of a heat source of a computer system (not shown). In some embodiments, a high conductivity material (such as, for example, thermal grease, thermal paste, etc.) may be sandwiched between the heat source and the cold plate body 102 for good thermal contact between the two surfaces. Heat is transferred from the heat source through the cold plate body 102 to the liquid coolant circulating within cold plate assembly 100. Liquid coolant enters the fluid circulation body 104 through a coolant inlet port 104$_{IN}$, circulates within cold plate assembly 100, and exits the fluid circulation body 104 via a coolant outlet port 104$_{OUT}$. Within the cold plate assembly 100, the coolant may absorb heat from the metal parts of the cold plate assembly 100, such as the cold plate body 102. The inlet and outlet ports 104$_{IN}$ and 104$_{OUT}$ are connected, via suitable couplings and tubing, to a liquid cooling circulation system associated with the computer. Those of ordinary skill in the art will recognize that the general function of a liquid cooling system is well known in the art, and therefore, the functioning of these components will not be described in detail.

It should be emphasized that the illustration of FIG. 1 and its corresponding description herein is illustrative only, and embodiments of the current invention may include several variations from the exemplary embodiment illustrated in FIG. 1. For example, in some embodiments, the fluid circulation body 104 may be integrated with the cold plate body 102. In these embodiments, the liquid coolant entering the body through the inlet port $104_{IN}$ may circulate through pathways through the integrated fluid circulation body and cold plate body.

Figure 2A:
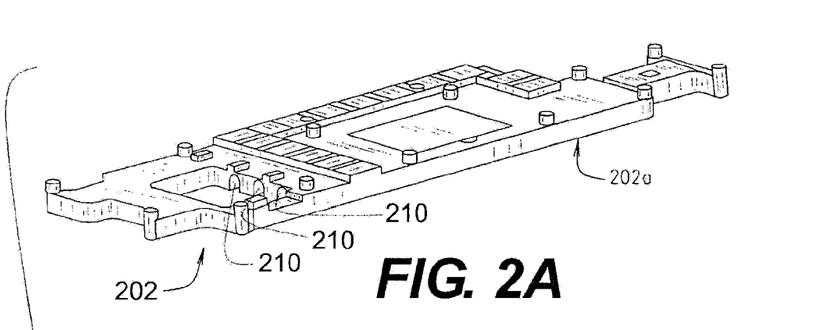
FIGS. 2A-2C illustrate the different parts of an embodiment of a thermal interposer assembly of the present disclosure.
Figure 2B:
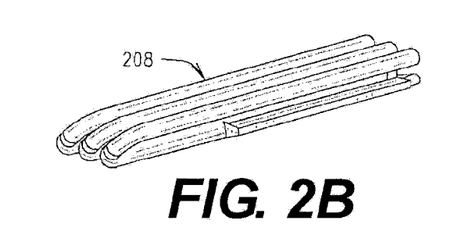
Figure 2C:
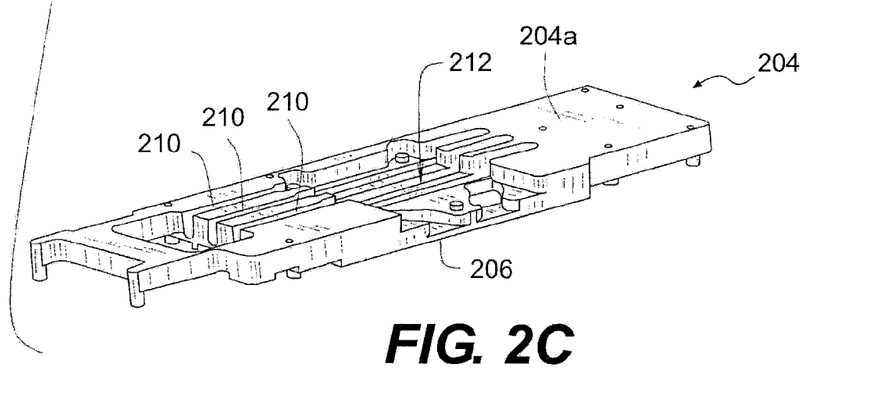

In general, the cold plate body may have any dimensions. Typically, the external dimensions of the modular cold plate assembly 100 may be configured to fit within a corresponding receiving space or socket within a thermal interposer assembly 200 of the present disclosure. Referring to FIGS. 2A-2C, an embodiment of a thermal interposer assembly 200 adapted for use with a personal computer adapter card (such as a graphics display adapter card) having multiple integrated circuits thereon is shown generally in these figures. These integrated circuits may include, but are not limited to, voltage regulators, switches, memory components, ASICs, LEDs, DSPs, and processing components, such as general purpose processors or dedicated graphics processing units. The thermal interposer assembly 200 consists of an upper planar segment 202 and a lower planar segment 204 which are stacked together such that surface 202a of upper planar segment 202 is proximate and facing surface 204a of lower planar segment. In some embodiments of thermal interposer assembly 200, surface 202a of upper planar segment 202 may be in contact with surface 204a of lower planar segment 204, while in other embodiments, there may be a gap between surfaces 202a and 204a. The upper and lower planar segments 202 and 204 may be unitary components, formed from a thermally conductive material (such as, for example, aluminum, copper, graphite, etc.) by any means (such as die-casting, machining, etc.) known in the art. In an exemplary embodiment, the upper and lower planar segments 202, 204 may include die-cast aluminum components. These components may be configured for attachment to a personal computer adapter card. The lower planar segment 204 of the planar body may be disposed with one side 206 generally in thermal contact with one or more heat sources (such as, for example, processors) on the adapter card. To ensure adequate thermal contact between the heat source and side 206 of the lower planar segment 206, a high conductivity material (such as, for example, thermal grease, thermal paste, thermal gap pads, etc.) may be positioned between these surfaces.

In some embodiments, thermal interposer assembly 200 may include one or more heat pipes 208. These heat pipes 208 may be seated within recesses 210 on faces 202a, 204a of upper planar segment 202 and lower planar segment 204. These heat pipes 208 may be configured to transfer the heat absorbed by the planar body away from the heat sources towards a thermal discharge region 212 of the thermal interposer assembly 200. The thermal discharge region 212 may be region of the thermal interposer assembly 200 which forms a receiving space or socket for the modular cold plate assembly 100. Those of ordinary skill in the art will recognize that the specific configuration of the heat pipes 208 within the planar body may be varied, depending upon the particular thermal transfer needs of each application. For example, as shown in FIG. 2B, the heat pipes may be disposed in a generally parallel configuration, terminating in, or passing through the thermal discharge region 212. However, in other embodiments, the heat pipes 208 may be eliminated or arranged in a different configuration. In some embodiments of the thermal interposer assembly 200 without the heat pipes 208, the recesses of the thermal interposer assembly may also be eliminated.

The thermal discharge region 212 may be a recessed region in one or both upper and lower planar segments 202, 204. This recessed region may function as a receiving slot or socket for the modular cold plate assembly 100. In some embodiments, the thermal discharge region 212 may be disposed in proximity to the heat source having the greatest thermal output, such as a CPU or GPU. As described above, the cold plate assembly 100 is coupled to a liquid coolant circulation system via inlet and outlet portions $104_{IN}$ and $104_{OUT}$. As the liquid coolant circulates through the cold plate assembly 100, thermal energy is drawn from the various heat sources in the computer adapted card through the thermal interposer assembly 200 and is transported via the liquid coolant flow for discharge remotely from the thermal interposer assembly 200 and associated heat sources.

Figure 3:
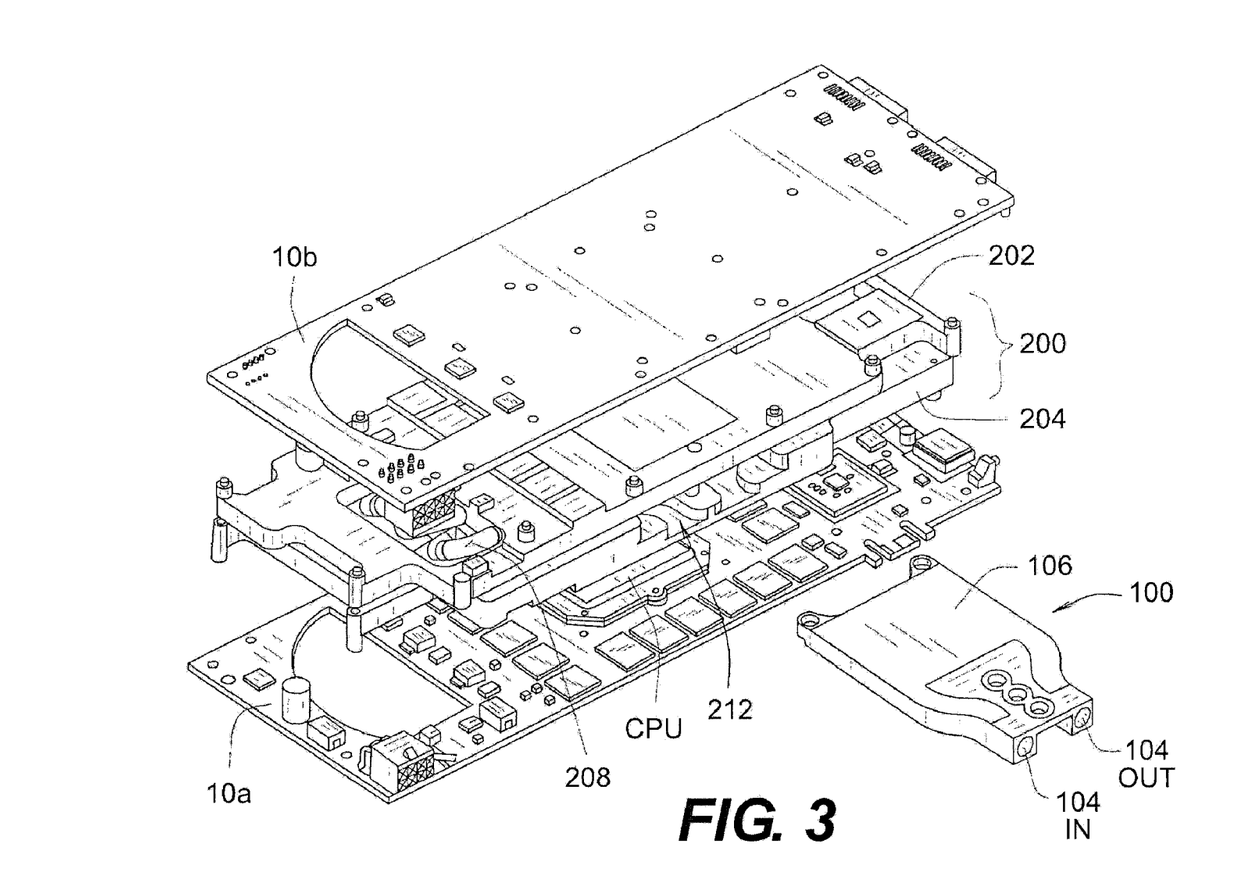
FIG. 3 is an exploded view of an adapter card assembly incorporating the embodiment of thermal interposer of FIGS. 2A-2C and the embodiment of cold plate assembly of FIG. 1.

Generally, as shown in FIG. 3, the dimensions of the thermal interposer assembly 200 may be selected based upon the configuration of the computer adapter card 10a, 10b which requires cooling. The dimensions of the thermal interposer component may be further selected to enable the combined assembly of the computer adapter card 10a, 10b, the thermal interposer assembly 200, and the cold plate assembly 100 to fit within the available space for the adapter card. In some embodiment, a length and a width of the thermal interposer assembly may be substantially the same as the length and width of the adapter card. The available space, in general, may be dictated by the attributes of the computer system. For instance, for an embodiment in which the thermal interposer assembly 200 is used to cool a computer adapter card plugged in an expansion slot of the computer, the thickness of the thermal interposer assembly 200 may be dictated by the physical space available between adjacent adapter cards. Those of ordinary skill in the art will recognize that the thermal interposer assembly 200 may have any of a variety of different configurations based upon the particular physical space limitations associated with the electronic components being cooled, and upon the arrangement of heat sources in thermal proximity to the surfaces of the thermal interposer. For example, while the embodiment shown in FIG. 3 illustrates a thermal interposer assembly 200 having a pair of planar bodies 202 and 204 disposed in a sandwiched configuration between a pair of circuit boards 10a and 10b, the embodiment shown in FIG. 4 illustrates an alternate configuration of the thermal interposer having only a single planar body 202 disposed adjacent a single circuit board 10, sized to fit within a double-slot PC card configuration.

Figure 4:
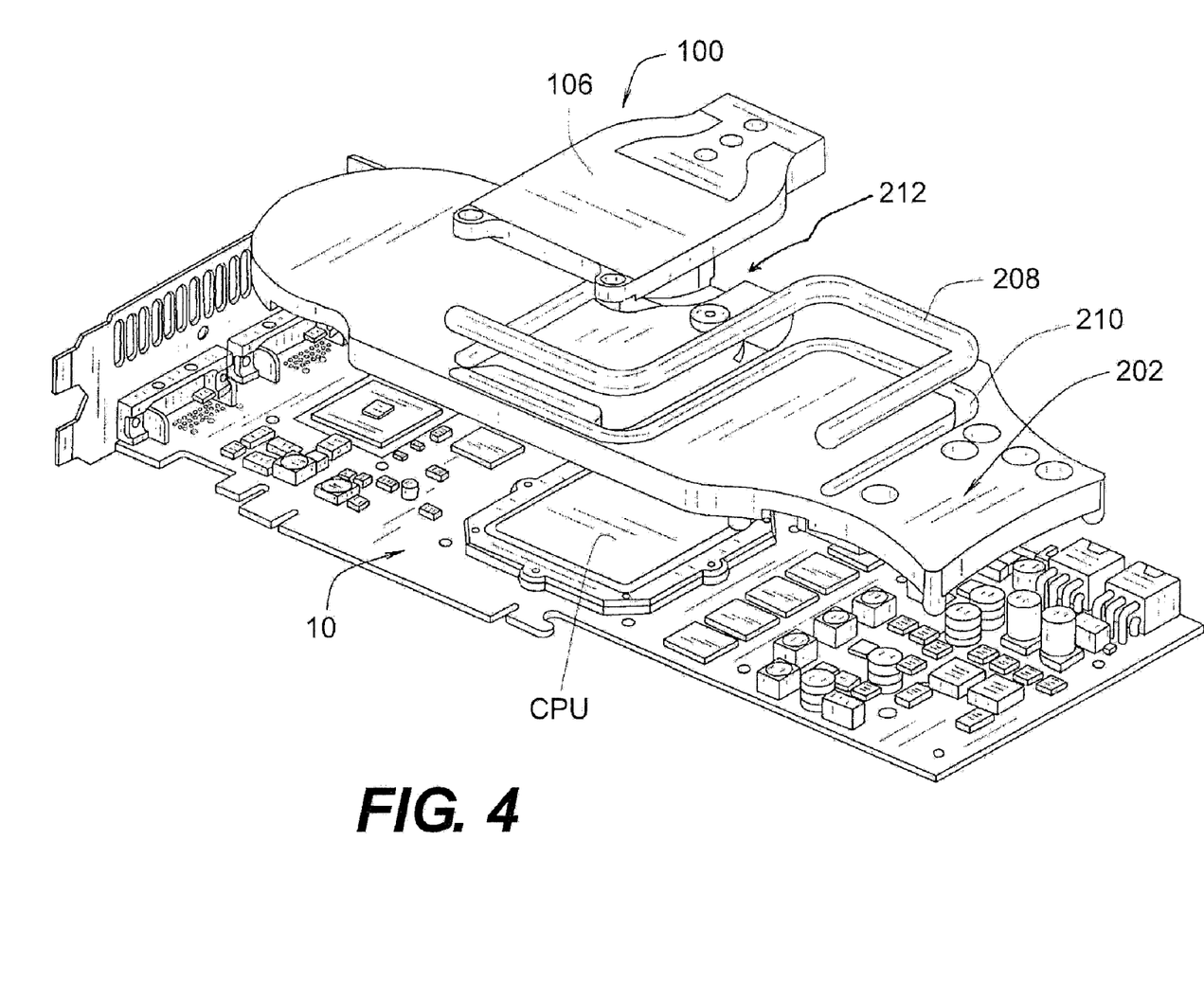
FIG. 4 is an exploded view of an adapter card assembly incorporating an alternate embodiment of a thermal interposer and a cold plate assembly of the present disclosure.

The embodiment shown in FIG. 4 illustrates an optional arrangement wherein only a single lower planar body 202 is utilized adjacent a single circuit board 10 and associated heat sources, without an upper planar body 204. The heat pipe 208 is routed through a serpentine path to facilitate transfer of thermal energy from the lower planar body 202 to the thermal transfer region 212, defined by a recessed seat or socket for receiving a modular cold plate assembly 100. It should be noted that a recess is not a requirement, and in some embodiments, the cold plate assembly may be removably attached to a thermal interposer assembly component (such as, for example, lower planar body 202 of FIG. 4) by another method. For example, the cold plate assembly 100 may be attached using screws or other fastening mechanisms.

The use of the thermal interposer assembly 200 of the present disclosure provides several advantages for the cooling and temperature management of personal computer adapter cards, circuit boards, or other electronic components. By removably coupling the modular cold plate assembly 100 to a thermal interposer assembly 200 which, in turn, is in thermal contact with the various heat sources on an adapter card 10 or circuit board, the design of the liquid cooling system (not shown) may be standardized and simplified. By facilitating a common cold plate assembly 100 to be used with different thermal interposer assemblies 200, modifying the cooling system is made easier. For example, in order to use a cold plate assembly 100 that was used to cool a first computer adapter card to cool a second computer adapter card (having a different configuration), only the thermal interposer assembly 200 (or one or more of the planar bodies of the assembly) needs be modified. This in turn, reduces development and production cycles, as well as production costs. Replacement or addition of adapter cards 10, to a system does not require breech or modification of the liquid coolant circulation pathways. Modular cold plate assembly 100 provides a standardized component which may be disconnected from a thermal interposer assembly 200 and re-installed in a different thermal interposer assembly without removal from the liquid coolant system or breach of the liquid coolant pathways, thereby reducing the risk of coolant loss, leaks, or the introduction of air into the system.

Figure 5:
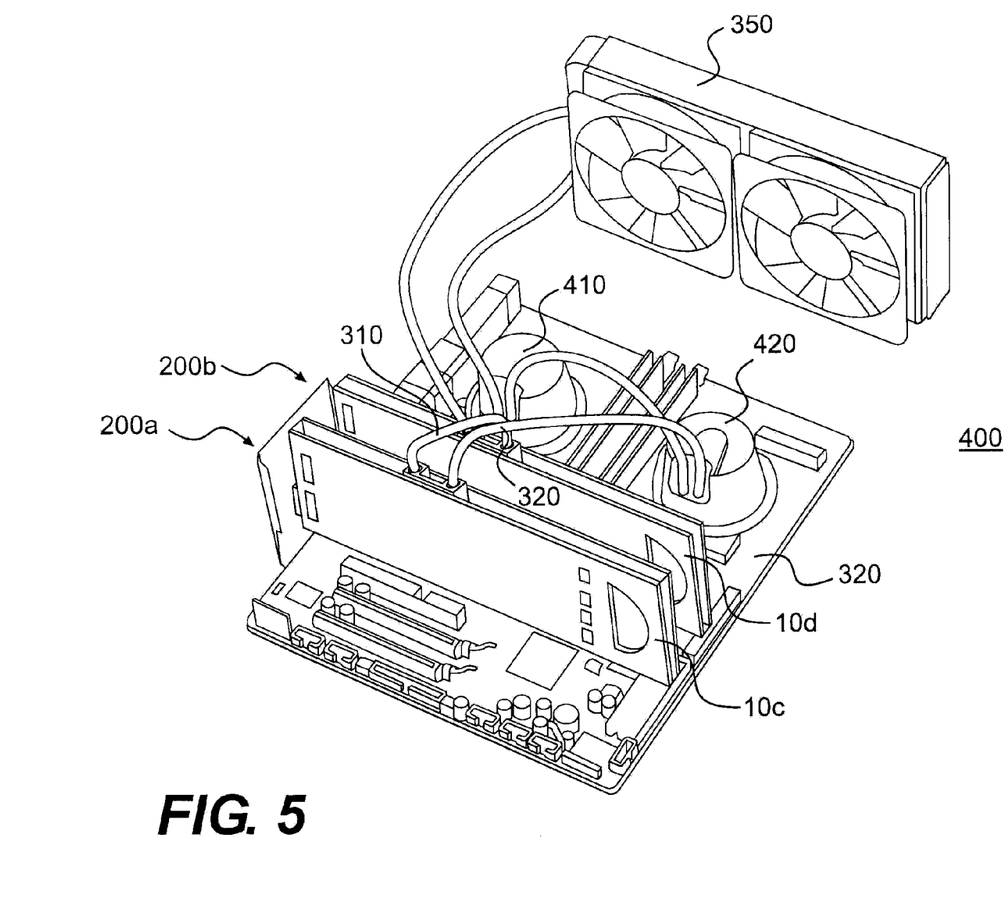
FIG. 5 in an illustration of an exemplary cooling system of a computer using an embodiment of the thermal interposer and cold plate assembly.

An exemplary embodiment of a liquid cooling system of a computer system will now be described to illustrate a method of using the thermal interposer assembly of the current disclosure. FIG. 5 shows a liquid cooling system 400 of a computer system. The cooling system may include cooling modules 410 and 420 that are adapted to cool heat-generating electronic components (such as, for example, CPUs) mounted on the mother board 320 of the computer. These cooling modules 410 and 420 may, without limitation, be any liquid cooling solution that is configured to cool the respective electronic components. Cooling system 400 may also include two thermal interposer assemblies 200a and 200b that are coupled to adapter cards 10c and 10d, respectively, which are plugged into the mother board. These thermal interposer assemblies 200a and 200b may have the same configuration (and the same elements) as thermal interposer assembly 200 illustrated in FIGS. 2A-2C and FIG. 3, described previously. For clarity, the elements of thermal interposer assemblies 200a and 200b are not identified in FIG. 5. In the discussion that follows, reference will be made to the elements of the thermal interposer assembly 200 depicted in FIGS. 2A-2C and FIG. 3. It should be noted that any thermal interposer assembly of the current disclosure can be used with liquid cooling system 400.

Thermal interposer assemblies 200a and 200b may be coupled to adapter cards 10c and 10d by any means known in the art. Thermal interposer assembly 200a may be coupled to adapter card 10c such that side 206 of lower planar segment 204 of the thermal interposer assembly 200a (see FIGS. 2A-2C) is in thermal contact with one or more heat sources of the adapter card 10c. A thermal conducting medium such as thermal grease may be placed between the mating surface of side 206 and the heat source for good thermal contact between these surfaces. The thermal interposer assemblies 200a and 200b also includes cold plate assemblies 100a and 100b positioned in the heat transfer regions 212 of the respective thermal interposer assemblies. These cold plate assemblies 100a and 100b circulate cooling liquid therethrough, as described previously. In the illustration of FIG. 5, the cooling liquid is shown to pass through the two cooling modules 410 and 420 and the two thermal interposer assemblies 200a and 200b in a serial manner. That is, cooling liquid exiting cooling module 410 enters cooling module 420, and the cooling liquid exiting cooling module 420 passes through thermal interposer assembly 200a, and then through thermal interposer assembly 200b, before being directed to the heat exchanger 350. At the heat exchanger 350, the hot cooling liquid may be cooled by air flowing therethrough. Under this arrangement, inlet tube 320 that directs the cooling liquid into thermal interposer assembly 200a (from cooling module 420), may be coupled with inlet port $104_{IN}$ of cold plate assembly 100a, and outlet port $104_{OUT}$ of cold plate assembly 100a may be coupled with outlet tube 310 to circulate, the cooling liquid through cold plate assembly 100a (as described previously with respect to FIG. 3). However, as people of ordinary skill in the art know, this arrangement of the liquid cooling system 400 is not a limitation and the liquid cooling system may be arranged in any manner without limitation. In a typical application, the cooling system 400 may be arranged such that hotter components are cooled first with the cooler liquid coming from the heat exchanger 350.

If it is desired to upgrade the computer by replacing adapter card 10a with another adapter card that includes additional heat-generating electronic components that need cooling (or by adding a new adapter card), the cooling system of the computer may be quickly and efficiently modified to cool the upgraded adapter card. This may be accomplished by replacing the thermal interposer assembly 200 (or the planar bodies 202, 204 of the thermal interposer assembly 200) with another thermal interposer assembly that is configured to cool the heat-generating components of the upgraded adapter card. The card assembly including the thermal interposer assembly 200 and cold plate component 100 may be configured to fit within a selected spatial volume corresponding to a single-slot adapter card or a double-slot adapter card of the computer. With a thermal interposer assembly 200 in thermal contact with one or more heat sources, efficient cooling of multiple circuits on the adapter card 10 or circuit board is achieved with a common cooling system, eliminating the need for separate or individual cooling systems associated with each adapter card or circuit board. Heat drawn from the heat sources is retained within the planar bodies 202, 204 of the thermal interposer assembly 200 for transfer to the liquid coolant circulating through the modular cold plate assembly 100, reducing heat transfer to the ambient air surrounding the adapter card and contained within the computer chassis. Similarly, by transferring heat to the liquid coolant, the need for air circulating fans in proximity to the adapter card or circuit board is reduced.

As various changes could be made in the above construction without departing from the scope of the disclosure, it is intended that all matter contained in the above description or shown in the accompanying drawings shall be interpreted as illustrative and not in a limiting sense. Similarly, the specific planar configuration of the planar body shown in the drawings will be understood to be exemplary, and may be modified as required to suit any of a variety of personal computer adapter card configurations without departing from the scope of the invention.

What is claimed is:

1. A thermal interposer for a heat-generating electronic component located on an adapter card plugged into a mother board of a computer, comprising:
   a substantially planar thermally conducting body configured to be thermally coupled to the electronic component located on the adapter card, the thermally conducting body being oriented substantially perpendicular to the mother board and including,
      a first region located on a first face of the thermally conducting body, the first region being adapted to be in thermal contact with a surface of the electronic component, a second region located on a second face of the thermally conducting body, the second face being opposite the first face; and a cold plate assembly removably coupled to the thermally conducting body and in thermal contact with the second region of the thermally conducting body, the cold plate assembly including, an inlet adapted to receive a cooling liquid into the cold plate assembly, and an outlet adapted to discharge the cooling liquid from the cold plate assembly.

2. The thermal interposer of claim 1, wherein the cold plate assembly is slidably coupled to the thermally conducting body.

3. The thermal interposer of claim 1, wherein the second region includes a recessed region in the thermally conducting body.

4. The thermal interposer of claim 1, further including a third region spaced apart from the first region, the third region being adapted to be in thermal contact with a surface of a second heat-generating electronic component.

5. The thermal interposer of claim 4, wherein the first third region is located on the first face of the thermally conducting body.

6. The thermal interposer of claim 1, wherein a size of the thermal interposer is substantially the same as a size of the adapter card.

7. A thermal interposer for a heat-generating electronic component, comprising:

a thermally conducting body configured to be thermally coupled to the electronic component, the thermally conducting body including, a first region located on a first face of the thermally conducting body, the first region being adapted to be in thermal contact with a surface of the electronic component, a second region located on a second face of the thermally conducting body, the second face being opposite the first face;

a cold plate assembly removably coupled to the thermally conducting body and in thermal contact with the second region of the thermally conducting body, the cold plate assembly including, an inlet adapted to receive a cooling liquid into the cold plate assembly, and an outlet adapted to discharge the cooling liquid from the cold plate assembly; and at least one heat pipe extending from a location proximate the first region to a location proximate the second region.

8. The thermal interposer component of claim 7, wherein the at least one heat pipe includes a plurality of heat pipes arranged substantially parallel to each other.

9. A thermal interposer for a heat-generating electronic component, comprising:

a thermally conducting body configured to be thermally coupled to the electronic component, the thermally conducting body including, a first region located on a first face of the thermally conducting body, the first region being adapted to be in thermal contact with a surface of the electronic component, a second region located on a second face of the thermally conducting body, the second face being opposite the first face;

a first planar component which includes the first face and the second face opposite the first face, and a second planar component having a third face and a fourth face opposite the third face, wherein the second planar component is stacked on the first planar component such that the second face of the first planar component faces the third face of the second planar component;

a cold plate assembly removably coupled to the thermally conducting body and in thermal contact with the second region of the thermally conducting body, the cold plate assembly including, an inlet adapted to receive a cooling liquid into the cold plate assembly, and an outlet adapted to discharge the cooling liquid from the cold plate assembly.

10. The thermal interposer of claim 9, wherein the second region includes a recessed region on at least one of the second face of the first planar component or the third face of the second planar component, and wherein the recessed region slidably receives the cold plate assembly.

11. The thermal interposer of claim 9, wherein the thermal interposer further includes a third region on the fourth face of the second planar component, the third region being adapted to be in thermal contact with a surface of a second heat-generating electronic component.

12. The thermal interposer of claim 9, further including a heat pipe extending between a location proximate the first region and a location proximate the second region and positioned within a cavity located on one or both of the second face or the third face.

13. A liquid cooling system of a computer, comprising:

a heat exchanger adapted for cooling a cooling liquid;

one or more tubes configured to direct the cooling liquid between the heat exchanger and a planar thermal interposer assembly; and the thermal interposer assembly coupled to a first adapter card of the computer such that the thermal interposer assembly is substantial parallel to the first adapter card, the first adapter card being plugged into a motherboard of the computer such that the first adapter card is substantially perpendicular to the mother board, the thermal interposer assembly including, a first thermally conducting body in thermal contact with a first heat dissipating electronic component on the first adapter card; and a cold plate assembly removably coupled with the thermally conducting body, the cold plate assembly being configured to circulate the cooling liquid therethrough.

14. The liquid cooling system of claim 13, wherein the heat exchanger is positioned remotely from the thermal interposer assembly.

15. The liquid cooling system of claim 13, wherein the thermal interposer assembly includes a heat pipe that is configured to transfer heat from the electronic component to the cold plate assembly.

16. The liquid cooling system of claim 13, wherein one face of the first thermally conducting body thermally contacts the first heat dissipating electronic component and an opposite face of the first thermally conducting body contacts the cold plate assembly.

17. The liquid cooling system of claim 13, wherein the thermal interposer assembly further includes a second thermally conducting body in thermal contact with a heat dissipating electronic component of a second adapter card and the cold plate assembly, the second thermally conducting body being positioned on one side of the cold plate assembly and the first thermally conducting body being positioned on an opposite side of the cold plate assembly.

18. The liquid cooling system of claim 13, wherein the cold plate assembly is slidably positioned in a recess formed in the thermal interposer assembly.

19. The liquid cooling system of claim 13, wherein the first thermally conducting body is in thermal contact with a second heat dissipating electronic component on the first adapter card.

20. The liquid cooling system of claim 13, wherein the thermal interposer assembly is in thermal contact with the first adapter card only through heat dissipating electronic components on the first adapter card.

21. A thermal interposer for a heat-generating electronic component located on an adapter card of a computer, the adapter card being plugged into a mother board of the computer, comprising:
   a planar thermally conducting assembly coupled to the adapter card such that a first region of the thermally conducting assembly is in thermal contact with a surface of the electronic component, the thermally conducting assembly having a length and a width substantially the same as a length and a width of the adapter card, the planar thermally conducting assembly being oriented substantially perpendicular to the motherboard; and
   a cold plate assembly removably coupled to the thermally conducting assembly, the cold plate assembly being configured to circulate a liquid coolant therethrough.

22. The thermal interposer of claim 21, wherein the cold plate assembly is slidably engaged in a recess located in the thermally conducting assembly.

23. The thermal interposer of claim 21, wherein the thermally conducting assembly includes a heat pipe.

24. A thermal interposer for a heat-generating electronic component located on an adapter card of a computer, the adapter card being plugged into a mother board of the computer, comprising:
   a thermally conducting assembly coupled to the adapter card such that a first region of the thermally conducting assembly is in thermal contact with a surface of the electronic component, the thermally conducting assembly having a length and a width substantially the same as a length and a width of the adapter card, wherein the thermally conducting assembly includes a first thermally conducting body in contact with a first side of the cold plate assembly and a second thermally conducting body in contact with a second side of the thermally conducting body, the first side being opposite the second side; and
   a cold plate assembly removably coupled to the thermally conducting assembly, the cold plate assembly being configured to circulate a liquid coolant therethrough.

25. The thermal interposer of claim 24, wherein the first region is located on the first thermally conducting body and the second thermally conducting body includes a second region in thermal contact with a second heat-generating electronic component located on a second adapter card that is plugged into the mother board.

* * * * *

UNITED STATES PATENT AND TRADEMARK OFFICE
CERTIFICATE OF CORRECTION

| | |
|---|---|
| PATENT NO. | : 8,274,787 B2 |
| APPLICATION NO. | : 12/826736 |
| DATED | : September 25, 2012 |
| INVENTOR(S) | : Monem H. Alyaser and Jeremy A. Rice |

Page 1 of 1

It is certified that error appears in the above-identified patent and that said Letters Patent is hereby corrected as shown below:

Claim 5, col. 9, lines 22-23, "the first third region" should read --the third region--.

Signed and Sealed this
First Day of January, 2013

David J. Kappos
*Director of the United States Patent and Trademark Office*